(12) United States Patent
Yang et al.

(10) Patent No.: US 11,217,281 B2
(45) Date of Patent: Jan. 4, 2022

(54) DIFFERENTIAL SENSING DEVICE WITH WIDE SENSING MARGIN

(71) Applicant: eMemory Technology Inc., Hsin-Chu (TW)

(72) Inventors: Cheng-Te Yang, Hsinchu County (TW); Cheng-Heng Chung, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 17/105,435

(22) Filed: Nov. 25, 2020

(65) Prior Publication Data
US 2021/0287742 A1 Sep. 16, 2021

Related U.S. Application Data

(60) Provisional application No. 62/988,403, filed on Mar. 12, 2020.

(51) Int. Cl.
| | |
|---|---|
| *G11C 11/00* | (2006.01) |
| *G11C 7/08* | (2006.01) |
| *G11C 11/16* | (2006.01) |
| *G11C 13/00* | (2006.01) |
| *G11C 16/04* | (2006.01) |
| *G11C 16/10* | (2006.01) |
| *G11C 16/14* | (2006.01) |
| *G11C 16/26* | (2006.01) |

(52) U.S. Cl.
CPC ............ *G11C 7/08* (2013.01); *G11C 11/1659* (2013.01); *G11C 11/1673* (2013.01); *G11C 13/003* (2013.01); *G11C 13/004* (2013.01); *G11C 16/0416* (2013.01); *G11C 16/10* (2013.01); *G11C 16/14* (2013.01); *G11C 16/26* (2013.01); *G11C 2013/0042* (2013.01); *G11C 2013/0045* (2013.01); *G11C 2207/063* (2013.01)

(58) Field of Classification Search
CPC ... G11C 7/08; G11C 11/1659; G11C 11/1673; G11C 13/003
USPC ........................................................ 365/148
See application file for complete search history.

(56) References Cited

U.S. PATENT DOCUMENTS

| | | | |
|---|---|---|---|
| 9,076,540 B2 | 7/2015 | Mueller | |
| 9,343,131 B1 | 5/2016 | DeBrosse | |
| 2015/0187414 A1* | 7/2015 | Perner | G11C 7/062 |
| | | | 365/148 |
| 2019/0206469 A1* | 7/2019 | Trinh Quang | G11C 7/062 |

\* cited by examiner

*Primary Examiner* — Vu A Le
(74) *Attorney, Agent, or Firm* — Winston Hsu

(57) ABSTRACT

A differential sensing device includes two reference cells, four path selectors, and four sample circuits. The first path selector is coupled to a first sensing node, the second reference cell, and a first memory cell. The second path selector is coupled to a second sensing node, the first reference cell, and the first memory cell. The third path selector is coupled to a third sensing node, the first reference cell, and a second memory cell. The fourth path selector is coupled to a fourth sensing node, the second reference cell, and the second memory cell. During a sample operation, the first sample circuit samples a first cell current, the second sample circuit samples the first reference current, the third sample circuit samples a second cell current, and the fourth sample circuit samples the second reference current.

14 Claims, 2 Drawing Sheets

DIFFERENTIAL SENSING DEVICE WITH WIDE SENSING MARGIN

CROSS REFERENCE TO RELATED APPLICATIONS

This non-provisional application claims priority of U.S. provisional application No. 62/988,403, filed on Mar. 12, 2020, included herein by reference in its entirety.

BACKGROUND OF THE INVENTION

1. Field of the Invention

The present invention is related to a differential sensing device, and more particular, to a differential sensing device with wide sensing margin.

2. Description of the Prior Art

Resistive random-access memory (ReRAM) has been widely used due to the low power and high speed characteristics. Generally, the ReRAM cell may include a storage element, and the resistance of the storage element will be changed when a proper high voltage is applied. For example, the storage element may include a transition metal oxide (TMO), and the resistance of the transition metal oxide will decrease when a proper high voltage is applied. Therefore, the storage element can be programmed by applying high voltages, and the data stored in the ReRAM cell can be read according to the resistance of the storage element.

In prior art, an accurate reference current is usually required to read the data stored in the ReRAM cell. However, since the physical characteristics of different memory cells are different, it is quite difficult to define one accurate reference current for all different memory cells. Furthermore, the read margin would be rather small if an inappropriate reference current is used, and the small read margin can also slow down the read process, affecting the efficiency of the ReRAM.

SUMMARY OF THE INVENTION

One embodiment of the present invention discloses a differential sensing device. The differential sensing device includes a first reference cell, a second reference cell, a first path selector, a second path selector, a third path selector, and a fourth path selector.

The first reference cell provides a first reference current, and the second reference cell provides a second reference current. The first path selector is coupled to a first sensing node, the second reference cell, and a first memory cell. The second path selector is coupled to a second sensing node, the first reference cell, and the first memory cell. The third path selector is coupled to a third sensing node, the first reference cell, and a second memory cell. The fourth path selector is coupled to a fourth sensing node, the second reference cell, and the second memory cell.

The first sample circuit is coupled the first sensing node, and samples a first cell current generated by the first memory cell during a sample operation. The second sample circuit is coupled to the second sensing node, and samples the first reference current during the sample operation. The third sample circuit is coupled to the third sensing node, and samples a second cell current generated by the second memory cell during the sample operation. The fourth sample circuit is coupled to the fourth sensing node, and samples the second reference current during the sample operation. The first reference current is smaller than the second reference current.

During a race operation, a voltage of the first sensing node is settled according to a race between the first cell current and the second reference current, a voltage of the second sensing node is settled according to a race between the first reference current and the first cell current, a voltage of the third sensing node is settled according to a race between the second cell current and the first reference current, and a voltage of the fourth sensing node is settled according to a race between the second reference current and the second cell current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
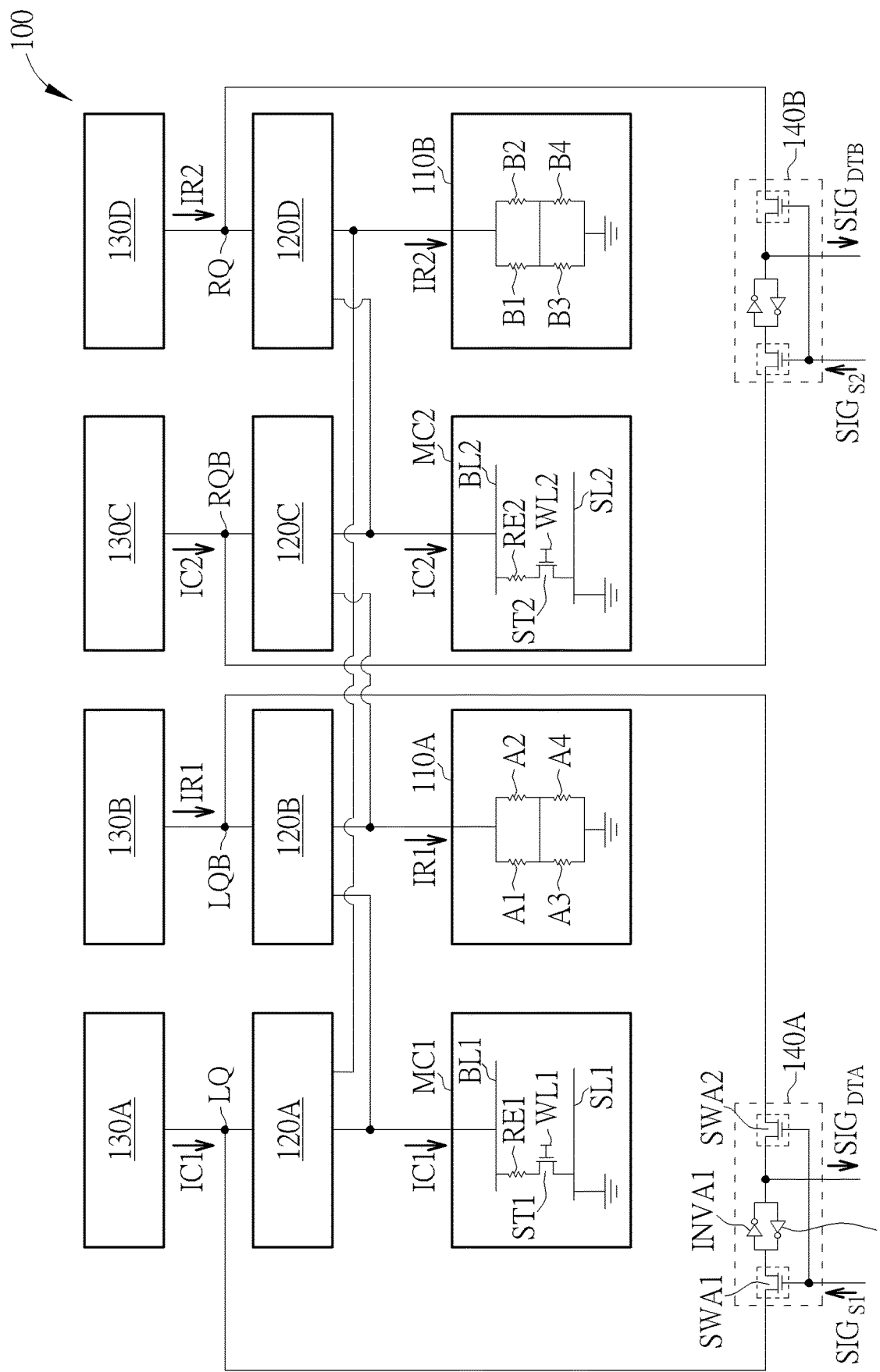
FIG. 1 shows a differential sensing device according to one embodiment of the present invention.

FIG. 1 shows a differential sensing device 100 according to one embodiment of the present invention. The differential sensing device 100 includes reference cells 110A and 110B, path selectors 120A, 120B, 120C, and 120D, and sample circuits 130A, 130B, 130C, and 130D. In some embodiments, the differential sensing device 100 can be used to read the data stored in memory cells MC1 and MC2.

The reference cell 110A can provide a reference current IR1, and the reference cell 110B can provide a reference current IR2. In some embodiments, the memory cells MC1 and MC2 can be resistive random-access memory (ReRAM) cells. For example, the memory cell MC1 can include a resistive element RE1 and a selection transistor ST1. The resistive element RE1 has a first terminal coupled to a bit line BL1, and a second terminal. The selection transistor ST1 has a first terminal coupled to the second terminal of the resistive element RE1, a second terminal coupled to a source line SL1, and a control terminal coupled to a word line WL1.

Similarly, the memory cell MC2 can include a resistive element RE2 and a selection transistor ST2. The resistive element RE2 has a first terminal coupled to a bit line BL2, and a second terminal. The selection transistor ST2 has a first terminal coupled to the second terminal of the resistive element RE2, a second terminal coupled to a source line SL2, and a control terminal coupled to a word line WL2.

In this case, the reference current IR1 can be used to simulate a cell current generated by a resistive random-access memory cell having a high resistance while the reference current IR2 can be used to simulate a cell current generated by a resistive random-access memory cell having a low resistance. For example, the reference cell 110A may include at least one resistive element having a high resistance, and the reference cell 110B may include at least one resistive element having a low resistance.

In FIG. 1, the reference cell 110A includes four resistive elements A1, A2, A3, and A4 having high resistance. Also, the resistive elements A1 and A2 coupled in parallel can be coupled in series with the resistive elements A3 and A4 coupled in parallel. Therefore, the variation of resistance of the four resistive elements A1 to A4 can be averaged, and the overall resistance of the reference cell 110A can be used as a more general reference for a high resistance memory cell. Similarly, the reference cell 110B can include four resistive elements B1, B2, B3, and B4 having low resistance for generating a more general simulation result for a low resistance memory cell. In this case, the reference current IR1 provided by the reference cell 110A would be smaller than the reference current IR2 provided by the reference cell 110B. In some embodiments, the reference cells 110A and 110B may include more resistive elements for providing even more general references according to the system requirement. However, in some other embodiments, the reference cell 110A and 110B can each include one resistive element for reducing the circuit area.

Also, in FIG. 1, the path selector 120A can be coupled to a sensing node LQ, the reference cell 110B, and the memory cell MC1. The path selector 120B can be coupled to a sensing node LQB, the reference cell 110A, and the memory cell MC1. The path selector 120C can be coupled to a sensing node RQB, the reference cell 110A, and the memory cell MC2. The path selector 120D can be coupled to a sensing node RQ, the reference cell 110B, and the memory cell MC2.

Furthermore, in FIG. 1, the sample circuit 130A can be coupled the sensing node LQ, the sample circuit 130B can be coupled to the sensing node LQB, the sample circuit 130C can be coupled to the sensing node RQB, and the sample circuit 130D can be coupled to the sensing node RQ.

In some embodiments, when the differential sensing device 100 is used to read the data stored in the memory cells MC1 and MC2, the differential sensing device 100 can perform a sample operation first. During the sample operation, the path selector 120A can form an electrical connection between the sensing node LQ and the memory cell MC1, and the path selector 120B can form an electrical connection between the sensing node LQB and the reference cell 110A. Also, the path selector 120C can form an electrical connection between the sensing node RQB and the memory cell MC2, and the path selector 120D can form an electrical connection between the sensing node RQ and the reference cell 110B.

In this case, during the sample operation, the sample circuit 130A can sample a cell current IC1 generated by the memory cell MC1, the sample circuit 130B can sample the reference current IR1, the sample circuit 130C can sample a cell current IC2 generated by the memory cell MC2, and the sample circuit 130D can sample the reference current IR2.

Consequently, after the sample operation, the voltage of the sensing node LQ would be adjusted to a stable value according to the cell current IC1, and the voltage of the sensing node LQB would be adjusted to a stable value according to the reference current IR1. Similarly, the voltages of the sensing nodes RQB and RQ would be adjusted to stable values according to the cell current IC2 and the reference current IR2 respectively. In some embodiments, to determine the data stored in the memory cells MC1 and MC2, the cell currents IC1 and IC2 will be compared with the reference currents IR1 and IR2 by performing a race operation after the sample operation.

During the race operation, the voltage of the sensing node LQ would be settled according to the race between the cell current IC1 and the reference current IR2, the voltage of the sensing node LQB would be settled according to the race between the reference current IR1 and the cell current IC1, the voltage of the sensing node RQB would be settled according to the race between the cell current IC2 and the reference current IR1, and the voltage of the sensing node RQ would be settled according to the race between the reference current IR2 and the cell current IC2. Consequently, the differential sensing device 100 can sense the voltages of the sensing nodes LQ, LQB, RQB, and RQ for reading the data stored in the memory cells MC1 and MC2.

For example, during the race operation, the path selector 120A can form an electrical connection between the sensing node LQ and the reference cell 110B, and the path selector 120B can form an electrical connection between the sensing node LQB and the memory cell MC1. Furthermore, during the race operation, the sample circuit 130A can hold the cell current IC1, and the sample circuit 130B can hold the reference current IR1. In this case, if the reference current IR2 is greater than the cell current IC1, then the voltage of the sensing node LQ would be pulled down by the reference current IR2. However, if the reference current IR2 is smaller than the cell current IC1, then the voltage of the sensing node LQ would be raised by the cell current IC1. That is, the voltage of the sensing node LQ can be used to indicate the result of subtracting the reference current IR2 by the cell current IC1. Similarly, the voltage of the sensing node LQB can be used to indicate the result of subtracting the cell current IC1 by the reference current IR1.

In the present embodiment, the reference current IR1 is smaller than the reference current IR2. Therefore, if the memory cell MC1 has a low resistance, the cell current IC1 would be slightly smaller than or equal to the reference current IR2 and would be significantly greater than the reference current IR1. In this case, the voltage of the sensing node LQ may not change significantly while the voltage of the sensing node LQB is dropped. However, if the memory cell MC1 has a high resistance, the cell current IC1 would be slightly greater than or equal to the reference current IR1 and would be significantly smaller than the reference current IR2. In this case, the voltage of the sensing node LQ will be dropped while the voltage of the sensing node LQB may not change significantly.

That is, when the memory cell MC1 has a low resistance, the voltage of the sensing node LQ will be greater than the voltage of the sensing node LQB. Also, when the memory cell MC1 has a high resistance, the voltage of the sensing node LQ will be smaller than the voltage of the sensing node LQB. Therefore, by observing the relation between the voltages of the sensing nodes LQ and LQB, the resistance of the memory cell MC1 can be identified, and thus, the data stored in the memory cell MC1 can be read.

In some embodiments, the differential sensing device 100 can further include a sensing amplifier 140A. The sensing amplifier 140A can be coupled to the sensing nodes LQ and LQB. The sensing amplifier 140A can output a data signal $SIG_{DTA}$ corresponding to the memory cell MC1 according to the voltage difference between the sensing nodes LQ and LQB.

In FIG. 1, the sensing amplifier 140A can be implemented with cross-coupled inverters. For example, the sensing amplifier 140A can include switches SWA1 and SWA2, and inverters INVA1 and INVA2. The switch SWA1 has a first terminal coupled to the sensing node LQ, a second terminal, and a control terminal for receiving a sensing control signal $SIG_{S1}$. The switch SWA2 has a first terminal coupled to the sensing node LQB, a second terminal, and a control terminal for receiving a sensing control signal $SIG_{S1}$. The inverter INVA1 has an input terminal coupled to the second terminal of the switch SWA1, and an output terminal coupled to the second terminal of the switch SWA2. The inverter INVA2 has an input terminal coupled to the second terminal of the switch SWA2, and an output terminal coupled to the second terminal of the switch SWA1.

In some embodiments, according to the sensing control signal $SIG_{S1}$, the switches SWA1 and SWA2 can be turned off during the sample operation, and can be turned on when the voltages of the sensing nodes LQ and LQB have reached stable values during the race operation. When the switches SWA1 and SWA2 are turned on, the inverters INVA1 and INVA2 can enlarge the difference between the voltages of the sensing nodes LQ and LQB and soon reach to a latched state. Consequently, the sensing amplifier 140A can output the data signal accordingly through the output terminal of the inverter INVA1 and/or the output terminal of the inverter INVA2.

Similarly, during the race operation, the path selector 120C can form an electrical connection between the sensing node RQB and the reference cell 110A, and path selector 120D can form an electrical connection between the sensing node RQ and the memory cell MC2. Furthermore, during the race operation, the sample circuit 130C can hold the cell current IC2, and the sample circuit 130D can hold the reference current IR2. In this case, the voltage of the sensing node RQB can be used to indicate the result of subtracting the reference current IR1 by the cell current IC2. Similarly, the voltage of the sensing node RQ can be used to indicate the result of subtracting the cell current IC2 by the reference current IR2.

Therefore, if the memory cell MC2 has a low resistance, the cell current IC2 would be slightly smaller than or equal to the reference current IR2 and would be significantly greater than the reference current IR1. In this case, the voltage of the sensing node RQ may not change significantly while the voltage of the sensing node RQB is raised. However, if the memory cell MC2 has a high resistance, the cell current IC2 would be slightly greater than or equal to the reference current IR1 and would be significantly smaller than the reference current IR2. In this case, the voltage of the sensing node RQ will be raised while the voltage of the sensing node RQB may not change significantly.

That is, when the memory cell MC2 has a low resistance, the voltage of the sensing node RQB will be greater than the voltage of the sensing node RQ. Also, when the memory cell MC2 has a high resistance, the voltage of the sensing node RQB will be smaller than the voltage of the sensing node RQ. Therefore, by observing the relation between the voltages of the sensing nodes RQ and RQB, the resistance of the memory cell MC2 can be identified, and thus, the data stored in the memory cell MC2 can be read.

In some embodiments, the differential sensing device 100 can further include a sensing amplifier 140B. The sensing amplifier 140B can be coupled to the sensing nodes RQ and RQB. The sensing amplifier 140B can be controlled by the control signal $SIG_{s2}$ and output a data signal $SIG_{DTB}$ corresponding to the memory cell MC2 according to the voltage difference between the sensing nodes RQ and RQB.

In this case, the differential sensing device 100 can read the data stored in the two memory cells MC1 and MC2 in parallel with the sensing amplifiers 140A and 140B while the hardware for sampling and providing the reference currents IR1 and IR2 can be shared, thereby reducing the circuit area required by the differential sensing device 100 and improving the reading efficiency of the differential sensing device 100. Furthermore, since the reference cells 110A and 110B can provide the reference currents IR1 and IR2 to simulate the currents generated by a high resistance memory cell and a low resistance memory cell respectively, the sensing margin can be increased, thereby improving the sensing accuracy.

However, in some embodiments, the reference currents IR1 and IR2 provided by the reference cells 110A and 110B can also be the same if the reference currents IR1 and IR2 are properly selected to be in the middle point between the current corresponding to a high resistance memory cell and the current corresponding to a low resistance memory cell. Furthermore, although the memory cells MC1 and MC2 shown in FIG. 1 are resistive random-access memory (ReRAM) cells, in some other embodiments, the memory cells MC1 and MC2 can be magnetoresistive random-access memory (MRAM) cells, and the reference cells 110A and 110B can include magnetoresistive elements for simulating the high resistance memory cell and the low resistance memory cell correspondingly.

Figure 2:
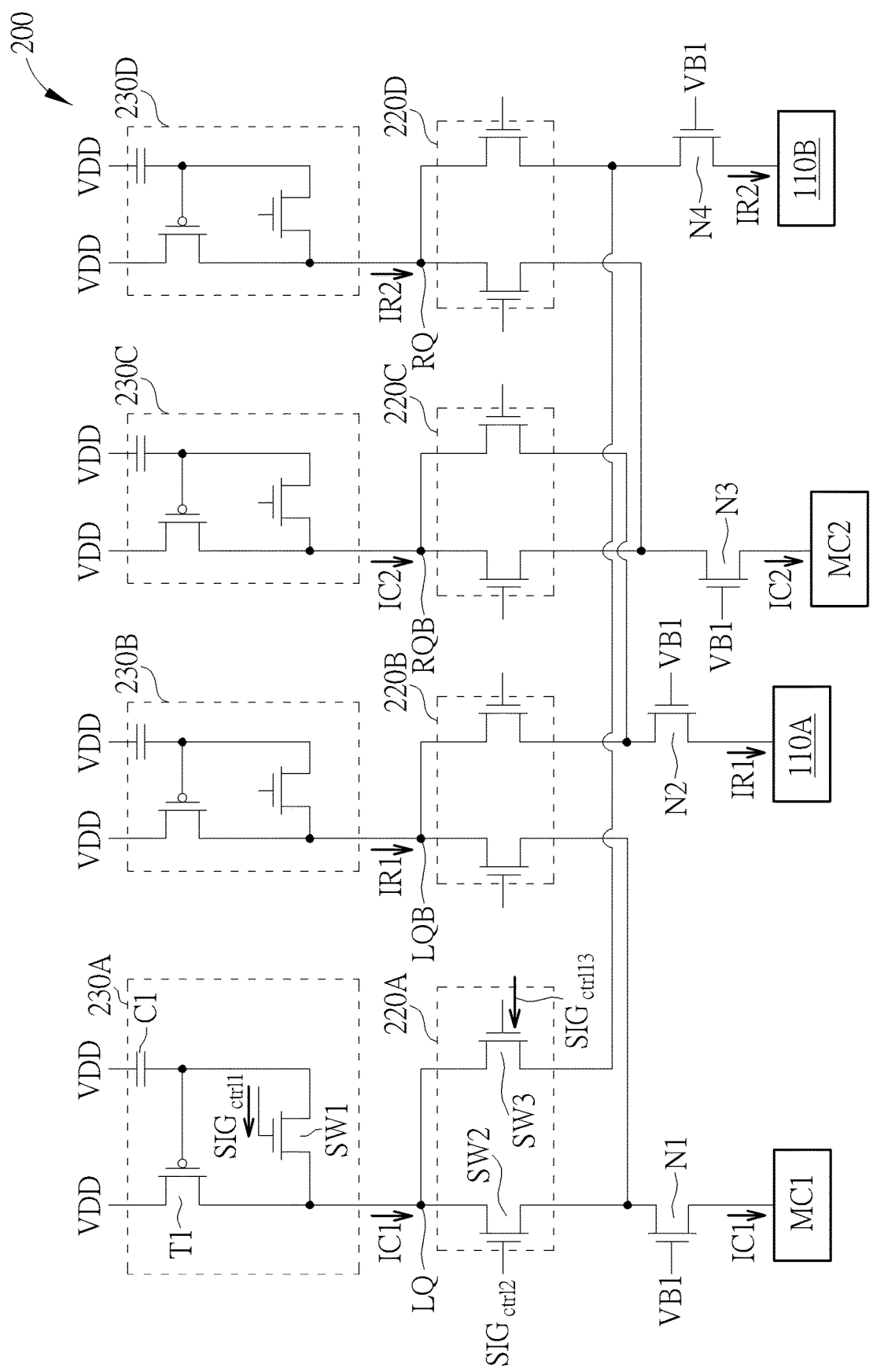
FIG. 2 shows a differential sensing device according to another embodiment of the present invention.

FIG. 2 shows a differential sensing device 200 according to another embodiment of the present invention. In some embodiments, the differential sensing devices 100 and 200 can have similar structures and can be operated with similar principles. The differential sensing device 200 includes reference cells 110A and 110B, path selectors 220A, 220B, 220C, and 220D, and sample circuits 230A, 230B, 230C, and 230D.

In FIG. 2, the sample circuits 230A, 230B, 230C, and 230D can have the same structure. For example, the sample circuit 230A can include a transistor T1, a capacitor C1, and a switch SW1. The transistor T1 has a first terminal coupled to a voltage terminal VDD, a second terminal coupled to the sensing node LQ, and a control terminal. The capacitor C1 has a first terminal coupled to the voltage terminal VDD, and a second terminal coupled to the control terminal of the transistor T1. The switch SW1 has a first terminal coupled to the control terminal of the transistor T1, a second terminal coupled to the second terminal of the transistor T1, and a control terminal for receiving a control signal $SIG_{ctr11}$.

Also, in FIG. 2, the path selectors 220A, 220B, 220C, and 220D can have the same structure. For example, the path selector 220A can include switches SW2 and SW3. The switch SW2 has a first terminal coupled to the sensing node LQ, a second terminal coupled to the memory cell MC1, and a control terminal for receiving a control signal $SIG_{ctr12}$. The switch SW3 has a first terminal coupled to the sensing node LQ, a second terminal coupled to the reference cell 110B, and a control terminal for receiving a control signal $SIG_{ctr13}$.

In this case, during the sample operation, the control signal $SIG_{ctr11}$ can turn on the switch SW1, the control signal $SIG_{ctr12}$ can turn on the switch SW2, and the control signal $SIG_{ctr13}$ can turn off the switch SW3. In this case, the sample circuit 230A can sample the cell current IC1 through the path selector 220A during the sample operation.

Also, during the race operation, the control signal $SIG_{ctr11}$ can turn off the switch SW1, the control signal $SIG_{ctr12}$ can turn off the switch SW2, and the control signal $SIG_{ctr13}$ can turn on the switch SW3. In this case, the sample circuit 230A can hold the cell current IC1 with the capacitor C1, and the voltage of the sensing node LQ will be adjusted according to the reference current IR2 provided by the reference cell 110B.

Similarly, the sample circuits 230B, 230C, and 230D can be controlled with the same control signal $SIG_{ctr11}$ as the sample circuit 230A. Also, the path selectors 220B, 220C, and 220D can be controlled with the same control signals $SIG_{ctr12}$ and $SIG_{ctr13}$ as the path selector 220A.

In some embodiments, the transistors T1 used in the sample circuits 230A, 230B, 230C, and 230D can be P-type transistors, and the switches SW2 and SW3 used in the path selector 220A, 220B, 220C, and 220D can be N-type transistors.

Furthermore, during the sample operation and the race operation, since the selection transistors ST1 and ST2 in the memory cells MC1 and MC2 are turned on and the source lines SL1 and SL2 are at a low voltage, the resistive elements RE1 and RE2 may be programmed if the voltages of the sensing node LQ and RQB are rather high. Therefore, in FIG. 2, the differential sensing device 200 can further include N-type transistors N1, N2, N3, and N4 for limiting the voltages received by the memory cells MC1 and MC2 and the reference cells 110A and 110B.

The N-type transistor N1 can have a first terminal coupled to the path selector 220A, a second terminal coupled to the memory cell MC1, and a control terminal for receiving a bias voltage VB1. The N-type transistor N2 can have a first terminal coupled to the path selector 220B, a second terminal coupled to the reference cell 110A, and a control terminal for receiving a bias voltage VB1. The N-type transistor N3 can have a first terminal coupled to the path selector 220C, a second terminal coupled to the memory cell MC2, and a control terminal for receiving a bias voltage VB1. The N-type transistor N4 can have a first terminal coupled to the path selector 220D, a second terminal coupled to the reference cell 110B, and a control terminal for receiving a bias voltage VB1.

Consequently, the voltages received by the memory cells MC1 and MC2 and the reference cells 110A and 110B can be limited by the N-type transistors N1, N2, N3, and N4 so that the resistance of the memory cells MC1 and MC2 and the reference cells 110A and 110B may be maintained.

In summary, the differential sensing device provided by the embodiments of the present invention can read the data stored in two memory cells in parallel so that the hardware for sampling and providing the reference currents can be shared. Therefore the circuit area required by the differential sensing device can be reduced, and the reading efficiency of the differential sensing device can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential sensing device comprising:
   a first reference cell configured to provide a first reference current;
   a second reference cell configured to provide a second reference current;
   a first path selector coupled to a first sensing node, the second reference cell, and a first memory cell;
   a second path selector coupled to a second sensing node, the first reference cell, and the first memory cell;
   a third path selector coupled to a third sensing node, the first reference cell, and a second memory cell;
   a fourth path selector coupled to a fourth sensing node, the second reference cell, and the second memory cell;
   a first sample circuit coupled the first sensing node, and configured to sample a first cell current generated by the first memory cell during a sample operation;
   a second sample circuit coupled to the second sensing node, and configured to sample the first reference current during the sample operation;
   a third sample circuit coupled to the third sensing node, and configured to sample a second cell current generated by the second memory cell during the sample operation; and
   a fourth sample circuit coupled to the fourth sensing node, and configured to sample the second reference current during the sample operation;
   wherein:
   the first reference current is smaller than the second reference current; and
   during a race operation:
      a voltage of the first sensing node is settled according to a race between the first cell current and the second reference current;
      a voltage of the second sensing node is settled according to a race between the first reference current and the first cell current;
      a voltage of the third sensing node is settled according to a race between the second cell current and the first reference current; and
      a voltage of the fourth sensing node is settled according to a race between the second reference current and the second cell current.

2. The differential sensing device of claim 1, wherein during the sample operation:
   the first path selector is configured to form an electrical connection between the first sensing node and the first memory cell;
   the second path selector is configured to form an electrical connection between the second sensing node and the first reference cell;
   the third path selector is configured to form an electrical connection between the third sensing node and the second memory cell; and
   the fourth path selector is configured to form an electrical connection between the fourth sensing node and the second reference cell.

3. The differential sensing device of claim 2, wherein during the race operation:
   the first path selector is configured to form an electrical connection between the first sensing node and the second reference cell;
   the second path selector is configured to form an electrical connection between the second sensing node and the first memory cell;
   the third path selector is configured to form an electrical connection between the third sensing node and the first reference cell; and
   the fourth path selector is configured to form an electrical connection between the fourth sensing node and the second memory cell.

4. The differential sensing device of claim 3, wherein during the race operation:
   the first sample circuit is configured to hold the first cell current;
   the second sample circuit is configured to hold the first reference current;
   the third sample circuit is configured to hold the second cell current; and
   the fourth sample circuit is configured to hold the second reference current.

5. The differential sensing device of claim 4, wherein the first sample circuit comprises:
   a first transistor having a first terminal coupled to a first voltage terminal, a second terminal coupled to the first sensing node, and a control terminal;

a first capacitor having a first terminal coupled to the first voltage terminal, and a second terminal coupled to the control terminal of the first transistor; and a first switch having a first terminal coupled to the control terminal of the first transistor, a second terminal coupled to the second terminal of the first transistor, and a control terminal configured to receive a first control signal;

wherein the first switch is turned on during the sample operation, and is turned off during the race operation.

6. The differential sensing device of claim 5, wherein the first transistor is a P-type transistor.

7. The differential sensing device of claim 1, wherein the first path selector comprises:
a second switch having a first terminal coupled to the first sensing node, a second terminal coupled to the first memory cell, and a control terminal configured to receive a second control signal; and
a third switch having a first terminal coupled to the first sensing node, a second terminal coupled to the second reference cell, and a control terminal configured to receive a third control signal.

8. The differential sensing device of claim 7, wherein the first switch and the second switch are N-type transistors.

9. The differential sensing device of claim 1, further comprising:
a first N-type transistor having a first terminal coupled to the first path selector, a second terminal coupled to the first memory cell, and a control terminal configured to receive a bias voltage;
a second N-type transistor having a first terminal coupled to the second path selector, a second terminal coupled to the first reference cell, and a control terminal configured to receive the bias voltage;
a third N-type transistor having a first terminal coupled to the third path selector, a second terminal coupled to the second memory cell, and a control terminal configured to receive the bias voltage; and
a fourth N-type transistor having a first terminal coupled to the fourth path selector, a second terminal coupled to the second reference cell, and a control terminal configured to receive the bias voltage.

10. The differential sensing device of claim 1, further comprising:
a first sensing amplifier coupled to the first sensing node and the second sensing node, and configured to output a first data signal corresponding to the first memory cell according to a voltage difference between the first sensing node and the second sensing node; and
a second sensing amplifier coupled to the third sensing node and the fourth sensing node, and configured to output a second data signal corresponding to the second memory cell according to a voltage difference between the third sensing node and the fourth sensing node.

11. The differential sensing device of claim 10, wherein the first sensing amplifier comprises:
a first switch having a first terminal coupled to the first sensing node, a second terminal, and a control terminal configured to receive a sensing control signal;
a second switch having a first terminal coupled to the second sensing node, a second terminal, and a control terminal configured to receive the sensing control signal;
a first inverter having an input terminal coupled to the second terminal of the first switch, and an output terminal coupled to the second terminal of the second switch; and
a second inverter having an input terminal coupled to the second terminal of the second switch, and an output terminal coupled to the second terminal of the first switch.

12. The differential sensing device of claim 1, wherein the first memory cell and the second memory cell are resistive random-access memory (ReRAM) cells.

13. The differential sensing device of claim 12, wherein:
the first reference cell comprises at least one resistive element having a high resistance; and
the second reference cell comprises at least one resistive element having a low resistance.

14. The differential sensing device of claim 1, wherein the first memory cell and the second memory cell are magnetoresistive random-access memory (MRAM) cells.

* * * * *